(12) United States Patent
Hong et al.

(10) Patent No.: US 10,693,016 B2
(45) Date of Patent: Jun. 23, 2020

(54) DISPLAY APPARATUS AND METHOD OF MANUFACTURING THE SAME

(71) Applicant: Samsung Display Co., Ltd., Yongin-si, Gyeonggi-Do (KR)

(72) Inventors: Pil Soon Hong, Gwangmyeong-si (KR); Hyunyoung Jung, Hwaseong-si (KR); Chulwon Park, Hwaseong-si (KR); Gwui-Hyun Park, Hwaseong-si (KR); Jeongmin Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/716,641

(22) Filed: Sep. 27, 2017

(65) Prior Publication Data

US 2018/0190832 A1 Jul. 5, 2018

(30) Foreign Application Priority Data

Dec. 30, 2016 (KR) .......................... 10-2016-0183414

(51) Int. Cl.
*H01L 29/66* (2006.01)
*H01L 29/786* (2006.01)
(Continued)

(52) U.S. Cl.
CPC ...... *H01L 29/78696* (2013.01); *H01L 27/124* (2013.01); *H01L 27/1288* (2013.01);
(Continued)

(58) Field of Classification Search
CPC ........... H01L 29/78696; H01L 29/6675; H01L 29/78663; H01L 29/04; H01L 29/7869; H01L 29/45; H01L 29/518; H01L 29/78606; H01L 29/786; H01L 29/4908; H01L 27/127; H01L 27/1214; H01L 27/1248; H01L 27/1222; H01L 27/1251; H01L 27/1262; H01L 27/1288; H01L 27/1259; H01L 27/3262; H01L 27/3276;
(Continued)

(56) References Cited

U.S. PATENT DOCUMENTS 5,990,492 A * 11/1999 Kim ...................... G02F 1/1368
257/347
2007/0295967 A1 * 12/2007 Harada ............. H01L 29/41733
257/72
(Continued)

FOREIGN PATENT DOCUMENTS

KR 100330165 B1 3/2002
KR 1020080069808 A 7/2008
KR 101300183 B1 8/2013

*Primary Examiner* — Natalia A Gondarenko
(74) *Attorney, Agent, or Firm* — Cantor Colburn LLP

(57) ABSTRACT

A display apparatus includes a thin film transistor on a first base substrate, the thin film transistor including a gate electrode disposed on the first base substrate, an active pattern disposed on the first base substrate and including a semiconductor layer including of amorphous silicon and an ohmic contact layer which is on the semiconductor layer, a drain electrode disposed on the ohmic contact layer and having a first thickness, and a source electrode disposed on the ohmic contact layer and having a second thickness which is greater than the first thickness.

9 Claims, 12 Drawing Sheets

(51) Int. Cl.
*H01L 27/12* (2006.01)
*H01L 29/417* (2006.01)

(52) U.S. Cl.
CPC .... *H01L 29/41733* (2013.01); *H01L 29/6675* (2013.01); *H01L 29/66765* (2013.01); *H01L 29/78663* (2013.01); *H01L 29/78669* (2013.01)

(58) Field of Classification Search
CPC ......... H01L 29/41733; H01L 29/42384; H01L 21/02554; H01L 21/441; H01L 21/02565; H01L 21/47573; H01L 29/0865–0869; H01L 29/0882–0886; H01L 29/41758; H01L 29/66606; H01L 29/66515; H01L 29/41725–41791; H01L 29/7839; H01L 27/11553; H01L 27/1158; H01L 51/0023; H01L 51/5234; H01L 51/5237; H01L 51/5253

USPC ......... 257/43, 57, 59, 72; 438/158, 481, 585
See application file for complete search history.

(56) References Cited

U.S. PATENT DOCUMENTS

| | | | |
|---|---|---|---|
| 2008/0123044 A1* | 5/2008 | Oh | G02F 1/136227 349/187 |
| 2009/0078937 A1* | 3/2009 | Saito | H01L 27/1285 257/59 |
| 2010/0264417 A1* | 10/2010 | Yoon | H01L 29/41733 257/59 |
| 2012/0298996 A1* | 11/2012 | Kao | H01L 29/41733 257/57 |
| 2014/0231810 A1* | 8/2014 | Park | H01L 29/41733 257/66 |
| 2017/0256620 A1* | 9/2017 | Lin | H01L 27/1214 |

\* cited by examiner

DISPLAY APPARATUS AND METHOD OF MANUFACTURING THE SAME

This application claims priority to Korean Patent Application No. 10-2016-0183414, filed on Dec. 30, 2016, and all the benefits accruing therefrom under 35 U.S.C. § 119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a display apparatus including a thin film transistor with a relatively short channel structure and a method of manufacturing the display apparatus.

2. Description of the Related Art

A display apparatus having a relatively light weight and small size has been manufactured. A cathode ray tube ("CRT") display apparatus has been used due to a relatively good performance and competitive price. However, the CRT display apparatus has a weakness with a size or portability thereof. Therefore a display apparatus such as a plasma display apparatus, a liquid crystal display apparatus and an organic light emitting display apparatus has been highly regarded due to the relatively small size, light weight and low-power-consumption.

SUMMARY

One or more example embodiment of the invention provides a display apparatus including a thin film transistor with a relatively short channel structure.

One or more exemplary embodiment of the invention also provides a method of manufacturing the display apparatus.

According to an exemplary embodiment of the invention, a display apparatus includes a thin film transistor on a first base substrate, the thin film transistor including: a gate electrode disposed on the first base substrate, an active pattern disposed on the first base substrate and including a semiconductor layer including amorphous silicon and an ohmic contact layer which is on the semiconductor layer, a drain electrode disposed on the ohmic contact layer and having a first thickness, and a source electrode disposed on the ohmic contact layer and having a second thickness which is greater than the first thickness.

In an exemplary embodiment, the gate electrode, the ohmic contact layer may include a first ohmic contact layer and a second ohmic contact layer which is spaced apart from the first ohmic contact layer. A width of a channel of the thin film transistor may be defined by a distance of the semiconductor layer between the first ohmic contact layer and the second ohmic contact layer spaced apart from each other.

In an exemplary embodiment, the width of the channel of the thin film transistor may be at least twice the first thickness of the drain electrode.

In an exemplary embodiment, the width of the channel may be about 1 micrometer (um) to about 2 um.

In an exemplary embodiment, the source electrode may include a first side surface adjacent to the drain electrode and a second side surface opposite to the first side surface, and a width of the upper surface of the source electrode may be smaller than a width of a lower surface of the source electrode. With respect to a normal direction to an upper surface of the first base substrate, the first side surface may be inclined at a first inclination angle and the second side surface may inclined at a second inclination angle. The first inclination angle is greater than the second inclination angle.

In an exemplary embodiment, the first inclination angle may be about 60 degrees to about 80 degrees, and the second inclination angle may be about 10 degrees to about 20 degrees.

In an exemplary embodiment, the second thickness of the source electrode may be at least 1.2 times the first thickness of the drain electrode.

In an exemplary embodiment, the first thickness may be about 0.5 um to about 1 um.

In an exemplary embodiment, the display apparatus may further include a first insulation layer disposed between the gate electrode and the active pattern, a second insulation layer disposed on the drain electrode, a pixel electrode disposed on the second insulation layer and electrically connected to the drain electrode through a contact hole formed through the second insulation layer, a gate line electrically connected to the gate electrode, and a data line electrically connected to the source electrode. A thickness of the data line defines the second thickness of the source electrode.

In an exemplary embodiment, the first ohmic contact layer and the drain electrode may have the same shape in a top plan view. The second ohmic contact layer and the source electrode may have the same shape in the top plan view.

According to an exemplary embodiment of the invention, a method of manufacturing a display apparatus includes forming a preliminary semiconductor layer including amorphous silicon on a gate electrode of a thin film transistor, on a first base substrate; forming a preliminary first ohmic contact layer on the preliminary semiconductor layer; forming a first conductive layer on the preliminary first ohmic contact layer; forming a first photoresist pattern on the first conductive layer; forming a drain electrode and a first ohmic contact layer of the thin film transistor each of which is disposed under the first photoresist pattern, respectively from the first conductive layer and the preliminary first ohmic contact layer, by pattering the first conductive layer and the preliminary first ohmic contact layer using the first photoresist pattern; forming a preliminary second ohmic contact layer and a second conductive layer on the preliminary semiconductor layer and on the first photoresist pattern under which the drain electrode is disposed; removing the first photoresist pattern and portions of the preliminary second ohmic contact layer and the second conductive layer thereon to expose the drain electrode and to expose a portion of the preliminary semiconductor layer between the drain electrode and the second conductive layer; forming a second photoresist pattern covering the exposed drain electrode, the exposed portion of the preliminary semiconductor layer between the drain electrode and the second conductive layer, and a portion of the second conductive layer adjacent to the drain electrode; and forming a source electrode, a second ohmic contact layer and a semiconductor layer of the thin film transistor, from the second conductive layer, the preliminary second ohmic contact and the preliminary semiconductor layer, respectively, by pattering the second conductive layer, the preliminary second ohmic contact and the preliminary semiconductor layer using the second photoresist pattern.

In an exemplary embodiment, in forming the drain electrode and the first ohmic contact layer, the first conductive layer may be patterned by an isotropic etching process to dispose an edge of the drain electrode inside an outer edge of the first photoresist pattern, the edge of the drain electrode spaced apart from the outer edge of the first photoresist pattern by a skew width.

In an exemplary embodiment, with the edge of the drain electrode spaced apart from the outer edge of the first photoresist pattern by the skew width, the second conductive layer and the preliminary second ohmic contact layer may be formed to be spaced apart from the drain electrode and the first ohmic contact layer, respectively, to expose the portion of the preliminary semiconductor layer between the second conductive layer and the drain electrode.

In an exemplary embodiment, the first conductive layer may have a first thickness, and the second conductive layer has a second thickness greater than the first thickness.

In an exemplary embodiment, the first photoresist pattern may include a negative type photoresist material, and a side surface of the first photoresist pattern may have a reverse tapered shape.

In an exemplary embodiment, the forming the first photoresist pattern may include forming a first-a photoresist layer including non-photosensitive resist composition on the first conductive layer, forming a first-b photoresist layer photosensitive resist composition on the first-a photoresist layer, and forming the first photoresist pattern including a first-a photoresist pattern and a first-b photoresist pattern by developing the first-b photoresist layer and the first-a photoresist layer.

In an exemplary embodiment, a width of a channel of the thin film transistor is defined by a distance of the semiconductor layer between the first ohmic contact layer and the second ohmic contact layer which are spaced apart from each other.

In an exemplary embodiment, the width of the channel may be about 1 um to about 2 um.

In an exemplary embodiment, in a cross-sectional view, the source electrode may include a first side surface adjacent to the drain electrode and a second side surface which is opposite to the first side surface, and a width of the upper surface of the source electrode may be smaller than a width of a lower surface of the source electrode. With respect to a normal direction to an upper surface of the first base substrate, the first side surface may be inclined at a first inclination angle and the second side surface may be inclined at a second inclination angle. The first inclination angle may be greater than the second inclination angle.

In an exemplary embodiment, the first inclination angle may be about 60 degrees to about 80 degrees, and the second inclination angle may be about 10 degrees to about 20 degrees.

According to one or more exemplary embodiment, as the width of the channel of the thin film transistor is relatively small, electrical characteristics of the thin film transistor may be improve and display quality of the display apparatus may be improved. In addition, the second thickness of the second pattern including the data line is greater than the first thickness of the first data pattern including the drain electrode, electrical characteristics of the display apparatus may be improve, and the display quality of the display apparatus may be improved.

It is to be understood that both the foregoing general description and the following detailed description are exemplary and explanatory and are intended to provide further explanation of the invention as claimed

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
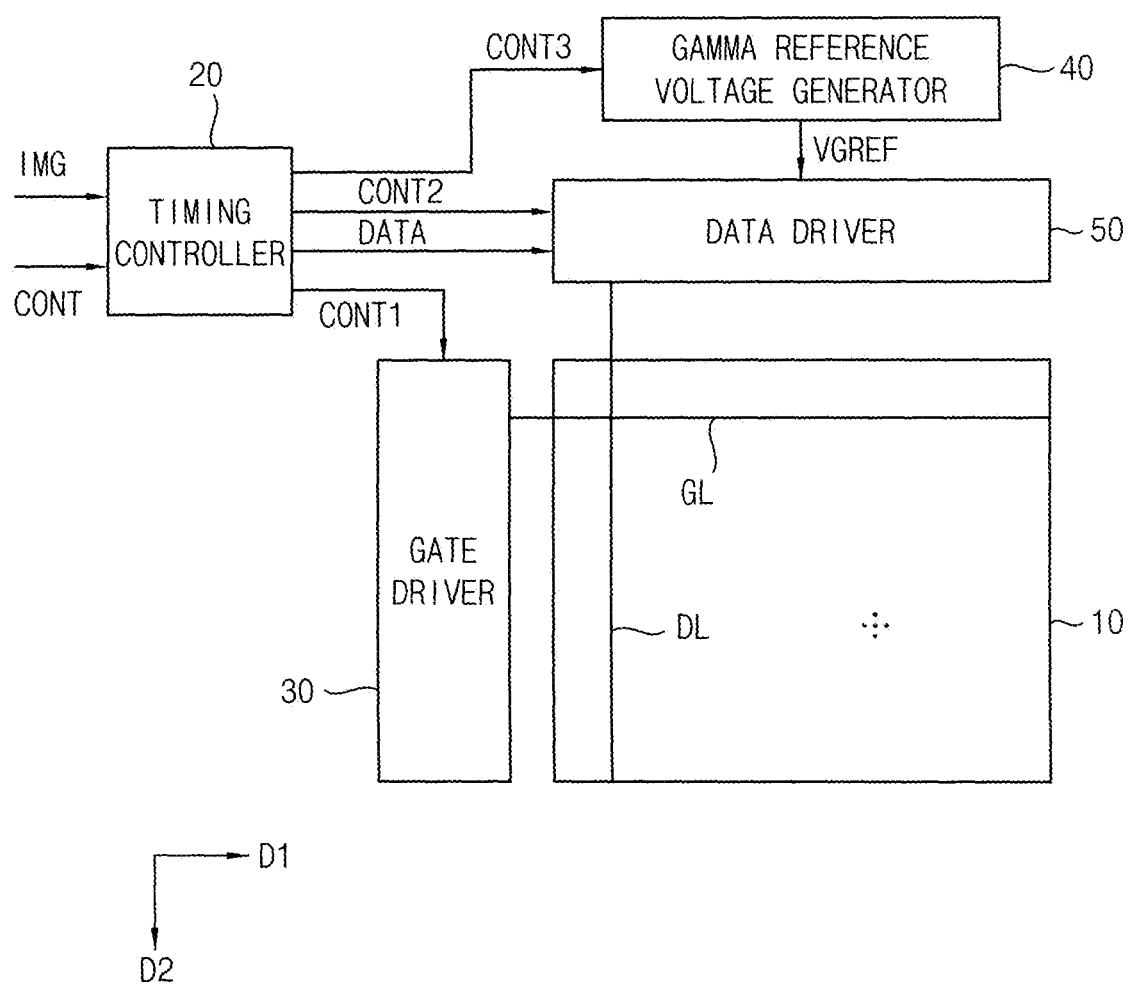
FIG. 1 is a block diagram illustrating an exemplary embodiment of a display apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

A display apparatus includes a switching element to control display of an image. The switching element may be a thin film transistor including a channel. A display quality of the display apparatus may be influenced by electrical characteristics of the thin film transistor. As a width of the channel of the thin film transistor is reduced, on/off characteristics of the thin film transistor is improved, resistive-capacitive ("RC") delay is reduced and charging rate is improved. Accordingly, there has been an effort to reduce the width of the thin film transistor channel (a so-called "short-channel structure"), but there has been a problem that the width of the channel cannot be reduced to a certain level or less due to a manufacturing process limit value.

Particularly, forming a thin film transistor channel having the width below a resolution level of a photolithography process may be difficult. Additionally, as the channel width becomes closer to a limit of the resolution level, there is a problem that dispersion increases and the display quality of the display apparatus deteriorates.

FIG. 1 is a block diagram illustrating an exemplary embodiment of a display apparatus according to the invention.

Referring to FIG. 1, the display apparatus may include a display panel 10 and a display panel driver. The display panel driver may collectively include a timing controller 20, a gate driver 30, a gamma reference voltage generator 40 and a data driver 50.

The display panel 10 may include a gate line GL provided in plurality, a data line DL provided in plurality, and a pixel electrically connected to a corresponding one of the gate lines GL and the data lines DL. The display panel 10 may display an image with light. Transmittance of the light may be control by a structure of the pixels. The gate lines GL may each define a length thereof which extends in a first direction D1 and the data lines DL may define a length thereof which extends in a second direction D2 crossing the first direction D1. The display panel 10 may be disposed in a plane defined by the first and second directions D1 and D2. A thickness of the display panel 10 is taken in a third direction which crosses both the first and second directions D1 and D2.

Each pixel may include a switching element, a liquid crystal capacitor and a storage capacitor. The liquid crystal capacitor and the storage capacitor are electrically connected to the switching element. The pixels may be disposed in a matrix form.

The display panel 10 may include a first substrate, a second substrate facing the first substrate and a liquid crystal layer disposed between the first substrate and the second substrate. The gate lines, the data lines, pixel electrodes of the pixels and the switching elements may be disposed or formed in the first substrate such as on a first base substrate thereof. A common electrode may be disposed or formed in the second substrate such as on a second base substrate thereof.

Figure 2:
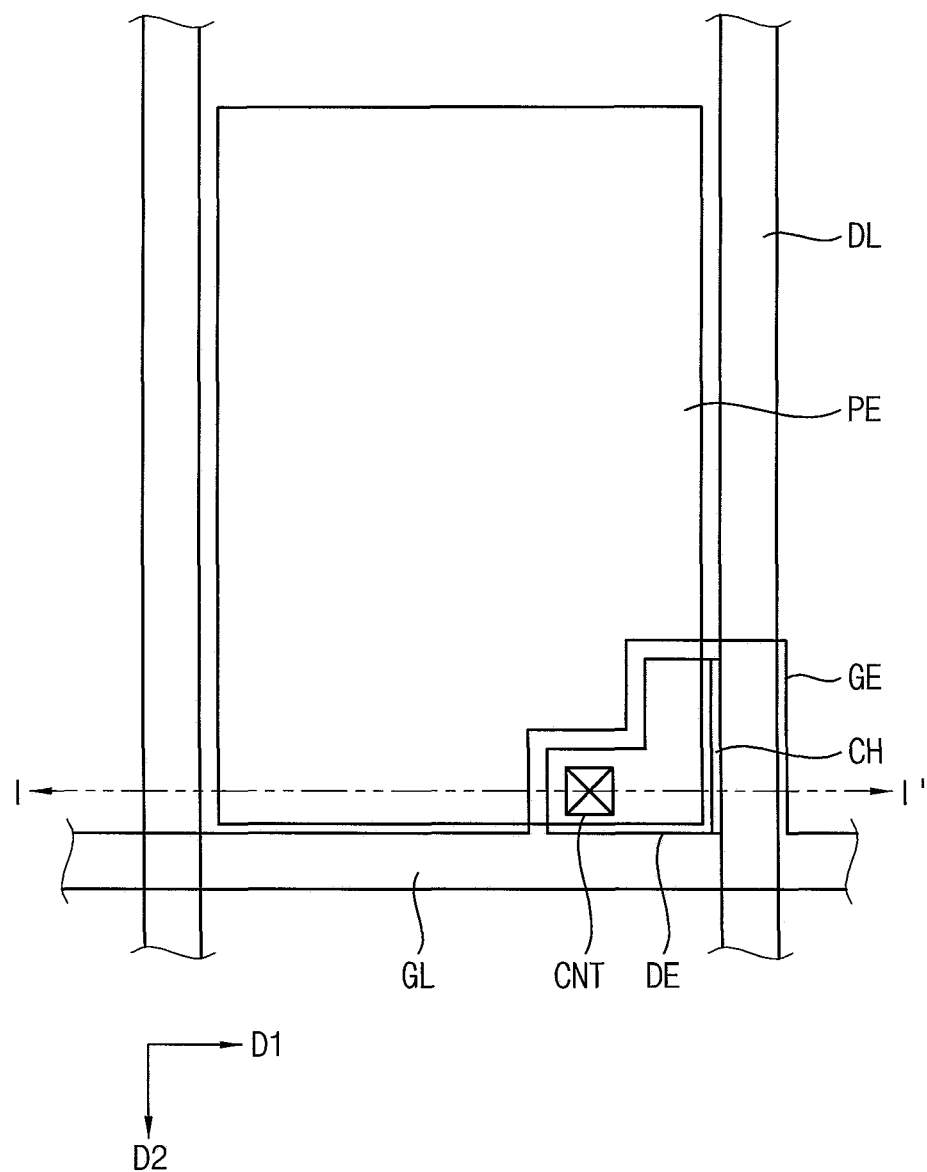
FIG. 2 is a top plan view illustrating an exemplary embodiment of a pixel of a display apparatus according to the invention.
Figure 3:
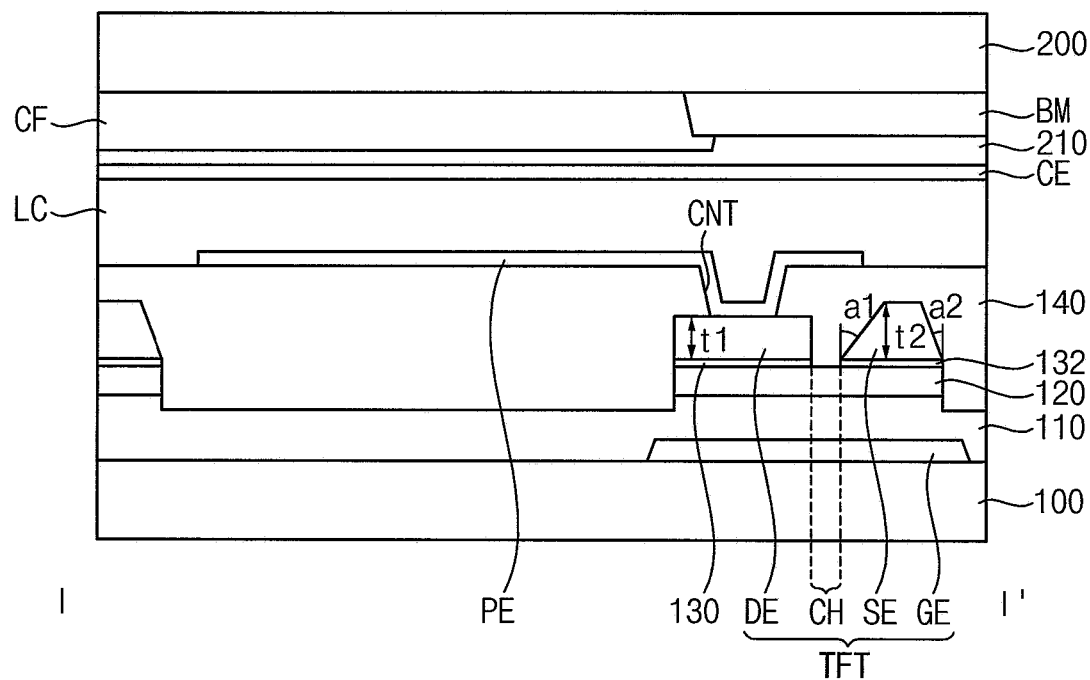
FIG. 3 is a cross-sectional view taken along line I-I' of FIG. 2.

The structure of the display panel 10 may be explained referring to FIGS. 2 and 3 in detail.

The timing controller 20 may receive input image data IMG and an input control signal CONT from an external apparatus (not shown). The input image data IMG may include color image data such as red image data, green image data and blue image data. The input control signal CONT may include a master clock signal and a data enable signal. The input control signal CONT may further include a vertical synchronizing signal and a horizontal synchronizing signal.

The timing controller 20 may generate a first control signal CONT1, a second control signal CONT2, a third control signal CONT3 and a data signal DATA based on the input image data IMG and the input control signal CONT.

The timing controller 20 may generate the first control signal CONT1 for controlling an operation of the gate driver 30 based on the input control signal CONT, and outputs the first control signal CONT1 to the gate driver 30. The first control signal CONT1 may further include a vertical start signal and a gate clock signal.

The timing controller 20 may generate the second control signal CONT2 for controlling an operation of the data driver 50 based on the input control signal CONT, and outputs the second control signal CONT2 to the data driver 50. The second control signal CONT2 may include a horizontal start signal and a load signal.

The timing controller 20 may generate the data signal DATA based on the input image data IMG. The timing controller 20 may output the data signal DATA to the data driver 50.

The timing controller 20 may generate the third control signal CONT3 for controlling an operation of the gamma reference voltage generator 40 based on the input control signal CONT, and output the third control signal CONT3 to the gamma reference voltage generator 40.

The gate driver 30 may generate gate signals to drive the gate lines GL in response to the first control signal CONT1 received from the timing controller 20. The gate driver 30 may sequentially output the gate signals to the gate lines GL.

The gamma reference voltage generator 40 may generate a gamma reference voltage VGREF in response to the third control signal CONT3 received from the timing controller 200. The gamma reference voltage generator 40 may provide the gamma reference voltage VGREF to the data driver 50. The gamma reference voltage VGREF may have a value corresponding to a level of the data signal DATA.

In an exemplary embodiment, the gamma reference voltage generator 40 may be disposed in the timing controller 20, or in the data driver 50.

The data driver 50 may receive the second control signal CONT2 and the data signal DATA from the timing controller 20, and receive the gamma reference voltages VGREF from the gamma reference voltage generator 40. The data driver 50 may convert the data signal DATA into data voltages having an analog type using the gamma reference voltages VGREF. The data driver 50 may output the data voltages to the data lines DL.

FIG. 2 is a top plan view illustrating an exemplary embodiment of a pixel of a display apparatus according to the invention. FIG. 3 is a cross-sectional view taken along line I-I' of FIG. 2.

Referring to FIGS. 2 and 3, the display apparatus may include a first substrate, a second substrate facing the first substrate, and an optical medium or light transmittance layer such as a liquid crystal layer LC disposed between the first substrate and the second substrate.

The first substrate may include a first base substrate 100, a gate pattern, a first insulation layer 110, an active pattern, a first data pattern, a second data pattern, a second insulation layer 140 and a pixel electrode PE.

The first base substrate 100 may include a transparent insulation substrate. In an exemplary embodiment, for example, the first base substrate 100 may include a glass substrate, a quartz substrate, a transparent resin substrate, etc. Examples of the transparent resin substrate for the first base substrate 100 may include polyimide-based resin, acryl-based resin, polyacrylate-based resin, polycarbonate-based resin, polyether-based resin, sulfonic acid containing resin, polyethyleneterephthalate-based resin, etc.

The gate pattern may be disposed on the first base substrate 100. The gate pattern may include a gate line GL which defines a length thereof extending in a first direction D1, and a gate electrode GE electrically connected to the gate line GL. The gate pattern may include metal. In an exemplary embodiment, for example, the gate pattern may include copper (Cu), titanium (Ti), molybdenum (Mo), aluminum (Al), silver (Ag), tungsten (W), nickel (Ni), chromium (Cr), platinum Ta), neodymium (Nd), scandium (Sc), etc. In addition, the gate pattern may include a plurality of metal layers.

The first insulation layer 110 may be disposed on the first base substrate 100 on which the gate pattern is disposed. The first insulation layer 110 may include a silicon compound, metal oxide, etc. In an exemplary embodiment, for example, the first insulation layer 110 may be disposed or formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 110 may have a single layer structure or a multi layer structure including the silicon oxide and/or the silicon nitride. In exemplary embodiments, the first insulation layer 110 may have a relatively large thickness in a thickness direction of the display panel 10 for sufficiently covering the gate pattern. In some exemplary embodiments, the first insulation layer 110 may be uniformly disposed or formed on the first base substrate 100 along a profile of the gate pattern. Here, the first insulation layer 110 may have a relatively small thickness, such that a stepped portion may be formed at a portion of the gate pattern owing to the profile of the gate pattern.

The active pattern may be disposed on the first insulation layer 110. The active pattern may be overlapped with the gate electrode GE. The active pattern may include a semiconductor layer 120 including amorphous silicon (a-Si: H) and an ohmic contact layer 130 and 132 including n+ amorphous silicon (n+ a-Si: H). The ohmic contact layer may include a first ohmic contact layer 130 and a second ohmic contact layer 132 which include same material as each other but are formed by different manufacturing processes.

The first ohmic contact layer 130 and the second ohmic contact layer 132 may be spaced apart from each other on the semiconductor layer 120. A channel CH of the thin film transistor TFT may be formed between the first ohmic contact layer 130 and the second ohmic contact layer 132. Referring to FIGS. 2 and 3, a width dimension of the channel CH may be defined by a distance between the first ohmic contact layer 130 and the second ohmic contact layer 132 in the first direction D1. A length dimension of the channel CH may be defined by an entire distance of the semiconductor layer 120 exposed between the first ohmic contact layer 130 and the second ohmic contact layer 132 in the first direction D1, taken in the second direction D2.

Here, as a width of the channel CH is decreased, the electrical characteristics of the thin film transistor TFT are improved. Accordingly, display quality of the display apparatus may be improved. A minimum value of the width of the channel CH may be determined according to a first thickness t1 of the first data pattern, which will be described later. This will be described in detail in the description of FIG. 4B to be described later. The width of the channel CH may be about 1 micrometer (μm) to about 2 um. In an exemplary embodiment, for example, when the first thickness t1 of the first data pattern is about 0.6 um, the width of the channel CH may be about 1.2 um.

The first data pattern and the second data pattern may be disposed on the active pattern. The first data pattern and the second data pattern may include metal. In an exemplary embodiment, for example, the first data pattern and the second data pattern may include copper (Cu), titanium (Ti), molybdenum (Mo), aluminum (Al), silver (Ag), tungsten (W), nickel (Ni), chromium (Cr), platinum Ta), neodymium (Nd), scandium (Sc), etc. In addition, the first data pattern and the second data pattern may include a plurality of metal layers.

The first data pattern may include a drain electrode DE, and have the first thickness t1. The first thickness t1 may be maximum dimension of the first data pattern taken from an underlying layer such as the first ohmic contact layer 130. The drain electrode DE may be disposed on the first ohmic contact layer 130, and may have a shape substantially same as the first ohmic contact layer 130 in the top plan view. That is, edges of the drain electrode DE and the first ohmic contact layer 130 may be aligned in the top plan view. The first thickness t1 may be about 0.5 um to about 1 um. In an exemplary embodiment, for example, when the first data pattern includes copper, the first thickness may be about 0.6 um.

As described later, since the first thickness t1 of the drain electrode DE is related to the width of the channel CH of the thin film transistor TFT, the first thickness t1 is determined in consideration of the width of the channel CH.

The second data pattern may include a data line DL, and a source electrode SE which is electrically connected to the data line DL. The second data pattern may have a second thickness t2. The second thickness t2 may be maximum dimension of the second data pattern taken from an underlying layer such as the second ohmic contact layer 132. The second thickness t2 may be greater than the first thickness t1. In the present embodiment, the source electrode SE is a portion of the data line DL, but is not limited thereto. In an exemplary embodiment, for example, the source electrode SE may be disposed or formed by being protruded from the data line DL in a direction different from that of the length of the data line DL.

The source electrode SE may be disposed on the second ohmic contact layer 132, and may have a shape substantially same as the second ohmic contact layer 132 in a top plan view. That is, edges of the source electrode SE and the second ohmic contact layer 132 may be aligned in the top plan view. In the top plan view, the source electrode SE may have a first side surface adjacent to the drain electrode DE and a second side surface opposite to the first side surface. In a cross-section (thickness direction), a width of an upper surface of the source electrode SE in the first direction D1 is smaller than that of a lower surface of the source electrode SE.

The first side surface may be disposed or formed to be inclined at a first inclination angle a1 with respect to a normal direction relative to an upper surface of the first base substrate 100, and the second side surface may be disposed formed to be inclined at a second inclination angle a2 with respect to the normal direction. The first inclination angle a1 may be larger than the second inclination angle a2. Thus, the source electrode SE may be formed so that a taper inclination toward the second (opposite) side is greater than a taper inclination toward the drain electrode DE. In an exemplary embodiment, for example, the first inclination angle a1 may be about 60 degrees to about 80 degrees, the second inclination angle a2 may be about 10 degrees to about 20 degrees.

The data line DL may define a length thereof which extends in a second direction D2 which crosses the first direction D1. The second direction D2 may be substantially perpendicular to the first direction D1, but the invention is not limited thereto.

Since the second data pattern including the source electrode SE and the data line DL is used as a signal line, electrical characteristics of the display apparatus (for example, RC delays, etc.) can be improved as the thickness of the second data pattern is increased within a range. Thus, unlike the first data pattern having the first thickness t1, the second pattern can have a relatively large thickness. In an exemplary embodiment, for example, the second thickness t2 may be about 1.2 times the first thickness t1.

The thin film transistor TFT may include the gate electrode GE, the active pattern having the channel CH, the drain electrode DE and the source electrode SE.

The second insulation layer 140 may be disposed or formed on the first insulation layer 110 on which the first and second data patterns are formed. The second insulation layer 140 may include an organic insulation material or an inorganic insulation material. In an exemplary embodiment, the second insulation layer 140 may have a substantially planar top surface while sufficiently covering the first and second data patterns. In an exemplary embodiment, the second insulation layer 140 may include or be formed with a substantially uniform thickness on the first insulation layer 110 on which the first and second data patterns are disposed.

The pixel electrode PE may be disposed on the second insulation layer 140. The pixel electrode PE may electrically connected to the drain electrode DE of the thin film transistor TFT at and through a contact hole CNT disposed or formed through the second insulation layer 140. The pixel electrode PE may include a transparent conductive material. In an exemplary embodiment, for example, the pixel electrode PE may include indium tin oxide ("ITO"), indium zinc oxide ("IZO"), etc.

The second substrate may include a second base substrate 200, a black matrix BM, a color filter CF, an over-coating layer 210 and a common electrode CE.

The second base substrate 200 may be disposed to face the first base substrate 100. The second base substrate 200 may include a transparent insulation substrate. In an exemplary embodiment, for example, the second base substrate 200 may include a glass substrate, a quartz substrate, a transparent resin substrate, etc. Examples of the transparent resin substrate for the second base substrate 200 may include polyimide-based resin, acryl-based resin, polyacrylate-based resin, polycarbonate-based resin, polyether-based resin, sulfonic acid containing resin, polyethyleneterephthalate-based resin, etc.

The black matrix BM may be disposed on the second base substrate 200. The black matrix BM may include a material which blocks light. The black matrix BM may overlap the thin film transistor TFT and signal lines such as the gate line GL, the data line DL, etc.

The color filter CF may be disposed on the second base substrate 200 on which the black matrix BM is disposed. The color filter CF may be provided in plurality. The color filter CF may supply a color to light passing through the liquid crystal layer LC. The color filter CF may collectively include a red color filter, a green color filter and blue color filter. A plurality of color filters CF may have different colors from each other and respectively correspond to pixels adjacent to each other. The color filter CF may be overlapped with adjacent color filter CF at a boundary between the adjacent pixels. In addition, the color filter CF may be spaced apart from an adjacent color filter CF at the boundary between the adjacent pixels.

The over-coating layer 210 may be disposed or formed on the color filter CF and the black matrix BM. The over-coating layer 210 may have a substantially planar top surface while sufficiently covering the color filter CF and the black matrix BM to flatten such elements, and may protect and insulate the color filter CF. The over-coating layer 210 may include acrylic-epoxy material.

The common electrode CE may be disposed on the over-coating layer 210. The common electrode CE may be disposed to face the pixel electrode PE. A common voltage may be applied to the common electrode CE. The common electrode CE may include transparent conductive material. In an exemplary embodiment, for example, the common electrode CE may include indium tin oxide ("ITO"), indium zinc oxide ("IZO"), etc.

The liquid crystal layer LC may be disposed between the pixel electrode PE and the common electrode CE. The liquid crystal layer LC may include liquid crystal molecules having optical anisotropy. The liquid crystal molecules are driven by electric field generated by electrodes of the display apparatus (e.g., the pixel electrode PE and the common electrode CE), so that an image is displayed by passing light through the liquid crystal layer LC or blocking light from passing through the liquid crystal layer LC.

According to the present embodiment, the width of the channel CH of the thin film transistor TFT is relatively small, electrical characteristics of the thin film transistor TFT may be improved and display quality of the display apparatus may be improved. In addition, the second thickness t2 of the second data pattern which includes the second data line DL is greater than the first thickness t1 of the first data pattern including the drain electrode DE. Thus, electrical characteristics of the display apparatus can be improved and the display quality can be improved.

FIGS. 4A to 4I are cross-sectional views illustrating an exemplary embodiment of a method of manufacturing a display apparatus according to the invention. The cross-sectional view of FIGS. 4A to 4I may be taken along line I-I' of FIG. 2, similar to that of FIG. 3.

Figure 4A:
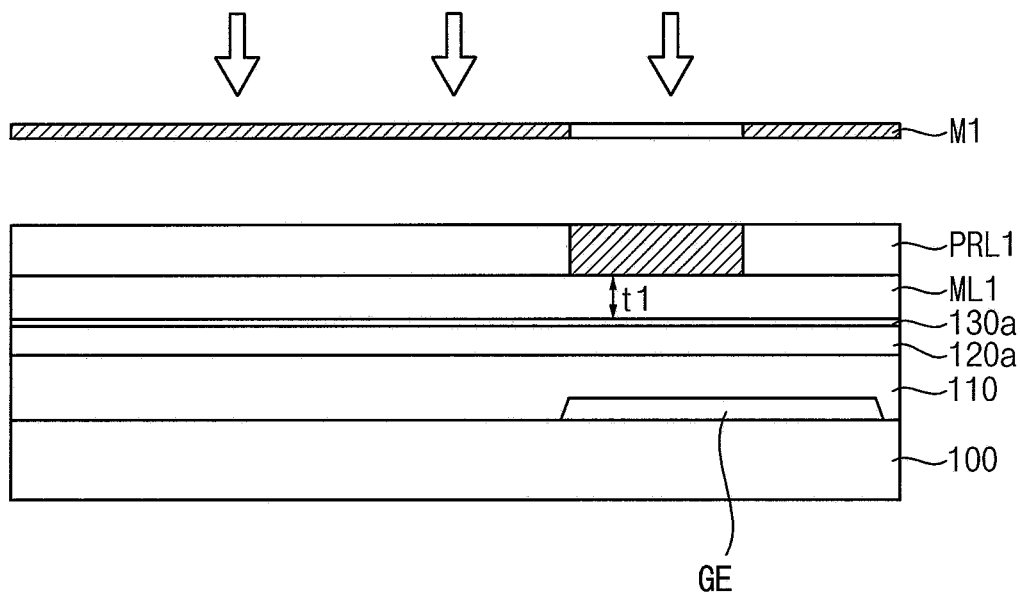
FIGS. 4A to 4I are cross-sectional views illustrating an exemplary embodiment of a method of manufacturing a display apparatus according to the invention.

Referring to FIG. 4A, a first base substrate 100 may be provided. A gate pattern including a gate electrode GE may be formed on the first base substrate 100. To form the gate pattern, a conductive material layer (not shown) may be formed on the first base substrate 100, such as on an entirety thereof, and then the conductive material layer may be partially etched by a photolithography process or an etching process using an additional mask. Hence, the gate pattern may be obtained. Here, the conductive material layer may be formed by a printing process, a sputtering process, a chemical vapor deposition ("CVD") process, a pulsed laser deposition ("PLD") process, a vacuum evaporation process, an atomic layer deposition ("ALD") process, and etc.

A first insulation layer 110 may be formed on the first base substrate 100 on which the gate pattern is formed. The first insulation layer 110 may be formed on an entirety of the first base substrate 100. The first insulation layer 110 may be obtained by a spin coating process, a CVD process, a plasma enhanced chemical vapor deposition ("PECVD") process, a high density plasma-chemical vapor deposition ("HDP-CVD") process, and etc.

A preliminary semiconductor layer 120a including of amorphous silicon (a-Si: H) may be formed on the first insulation layer 110. A preliminary first ohmic contact layer 130a including of n+ amorphous silicon (n+ a-Si: H) may be formed on the preliminary semiconductor layer 120a.

In the figures, although the preliminary first ohmic contact layer 130a is shown as being formed on the preliminary semiconductor layer 120a, the first ohmic contact layer 130a has a smaller thickness than the preliminary semiconductor layer 120a, and the first ohmic contact layer 130a supplies ions on an upper surface of the preliminary semiconductor layer 120a. Due to the ion supply, the upper surface of the preliminary semiconductor layer 120a may be formed to be disposed within a thickness of the preliminary first ohmic contact layer 130a.

A first conductive layer ML1 may be formed on the preliminary first ohmic contact layer 130a, such as on an entirety thereof. The first conductive layer ML1 may be formed by a printing process, a sputtering process, a CVD process, a PLD process, a vacuum evaporation process, an ALD process, and etc. The first conductive layer ML1 may have a first thickness t1.

A first photoresist layer PRL1 may be formed on the first conductive layer ML1. The first photoresist layer PRL1 may include a negative type photoresist material. In an exemplary embodiment, for example, the negative type photoresist material may include a photocurable composition containing a photopolymerization initiator, a thermosetting composition and an organic solvent. The first photoresist layer PRL1 may be exposed (downward arrows in FIG. 4A) using a first mask M1 which has a pattern corresponding to a drain electrode (refer to DE of FIG. 4C) which will be mentioned later.

Figure 4B:
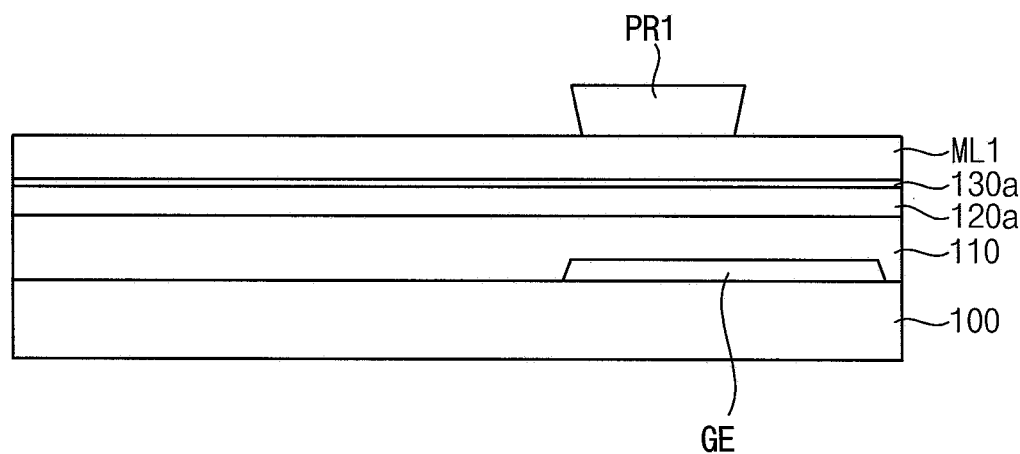

Referring to FIG. 4B, the first photoresist layer PRL1 which has been exposed, may be developed using a developer to form a first photoresist pattern PR1. The first photoresist layer PRL1 includes the negative type photoresist material, so that the first photoresist layer PRL1 which is corresponding to exposed area may have a reverse tapered shape. Thus, a width of an upper surface of the first photoresist pattern PR1 may be larger than that of a lower surface of the first photoresist pattern PR1.

Figure 4C:
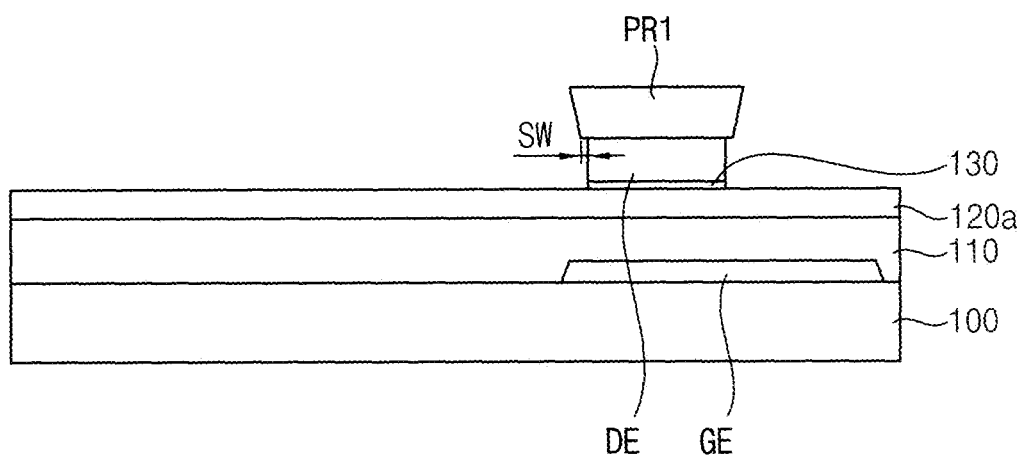

Referring to FIG. 4C, using the first photoresist pattern PR1 as a mask, the first conductive layer ML1 and the preliminary first ohmic contact layer 130a may be patterned. Accordingly, a drain electrode DE which is under the first photoresist pattern PR1 and a first ohmic contact layer 130 which is under the drain electrode DE may be formed from the first conductive layer ML1 and the preliminary first ohmic contact layer 130a, respectively. The first conductive layer ML1 may be patterned using the first photoresist pattern PR1 as an etch barrier by an isotropic etching process such as a wet etch process, Here, the first conductive layer ML1 is etched by the isotropic etching process and side surfaces of the first photoresist pattern PR1 form the reverse tapered shape, so that edges of the drain electrode DE are disposed to be inside an outer edge of the first photoresist pattern PR1 by a width SW, and skew may occur. Here, the width SW may determine a width of a channel of a thin film transistor as will be mentioned later. In the figures, although the width SW in the first direction D1 is shown to be relatively small compared to the first thickness t1 (refer to FIG. 4A) of the drain electrode DE, a value of the width SW can be greater than the first thickness t1. In an exemplary embodiment, for example, the width SW may be about twice the first thickness t1. The first conductive layer ML1 must be etched with a condition that the width SW is sufficiently larger than the first thickness t1, for patterning of an entirety of the first conductive layer ML1. When the width SW is smaller than the first thickness t1, an issue of under etching the first conductive layer ML1 can be caused.

Here, the first conductive layer ML1 and the preliminary first ohmic contact layer 130a can be simultaneously etched with a proper etchant. Thus, the drain electrode DE and the first ohmic contact layer 130 can be formed at the same time.

Referring to FIG. 4C, the etching of the first conductive layer ML1 and the preliminary first ohmic contact layer 130a to form the drain electrode DE and the first ohmic contact layer 130, portions of the preliminary semiconductor layer 120a are exposed.

Figure 4D:
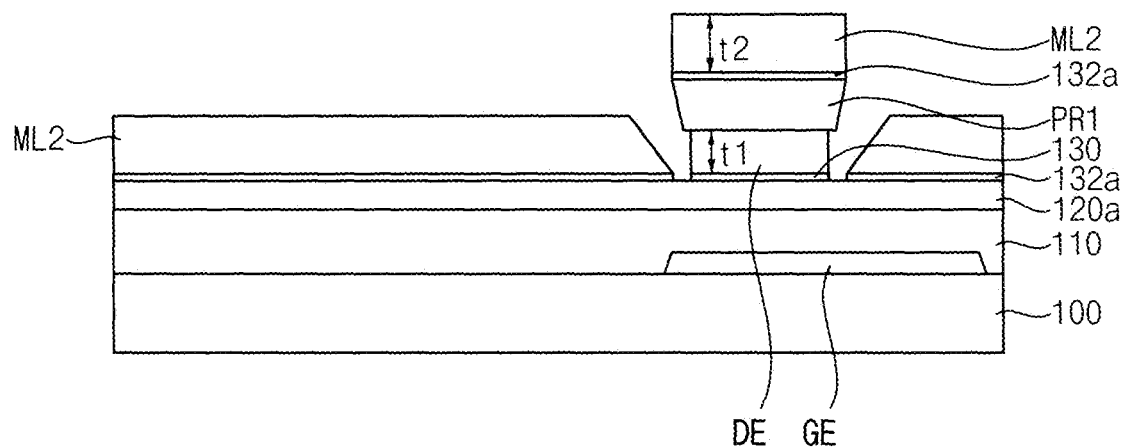

Referring to FIG. 4D, a preliminary second ohmic contact layer 132a and a second conductive layer ML2 may be formed on the first photoresist pattern PR1, the drain electrode DE and the exposed portions of the preliminary semiconductor layer 120a.

In the figures, although the preliminary second ohmic contact layer 132a is shown as being formed on the preliminary semiconductor layer 120a, the second ohmic contact layer 132a has a smaller thickness than the preliminary semiconductor layer 120a, and the second ohmic contact layer 132a supplies ions at an upper surface of the preliminary semiconductor layer 120a. Due to the supplied ions, the upper surface of the preliminary semiconductor layer 120a may be disposed at an inside of the preliminary second ohmic contact layer 132a.

The second conductive layer ML2 may be formed on the preliminary second ohmic contact layer 132a. The second conductive layer ML2 may be formed by a printing process, a sputtering process, a CVD process, a PLD process, a vacuum evaporation process, an ALD process, and etc. The second conductive layer ML2 may have a second thickness t2.

Here, because of the width SW and the reverse tapered shape of the first photoresist pattern PR1, an edge of the preliminary second ohmic contact layer 132a adjacent to the drain electrode DE is formed to be spaced apart from the first ohmic contact layer 130, an edge of the second conductive layer ML2 is spaced apart from the drain electrode DE, and the second conductive layer ML2 may have a tapered shape so that a side surface of the second conductive layer ML2 is inclined toward the drain electrode DE (a so called "shadow effect"). Here, a spacing distance between the drain electrode DE and the second conductive layer ML2 can be the width of the channel of the thin film transistor which will be described later. Portions of the preliminary semiconductor layer 120a may remain exposed between the edges of the preliminary second ohmic contact layer 132a and the second conductive layer ML2 at the first photoresist pattern PR1, and the first ohmic contact layer 130 and the drain electrode DE and under the first photoresist pattern PR1, respectively.

Here, the width of the channel of the thin film transistor is determined by the width SW which is formed due to the skew in the etching process. Thus, the width of the channel of the thin film transistor can be controlled by the amount of the skew in the etching process. Accordingly, a dispersion of the width of the channel of the thin film transistor depends on the skew amount of the etching process. Generally, a dispersion of the skew amount of the etching process is smaller than a dispersion by a photolithography process, and the skew amount of the etching process may be smaller than a resolution of the photolithography process. According to one or more exemplary embodiment, a thin film transistor having a relatively short-channel structure with improved quality is formed as compared with the prior art in which the channel is formed by a photolithography process.

Figure 4E:
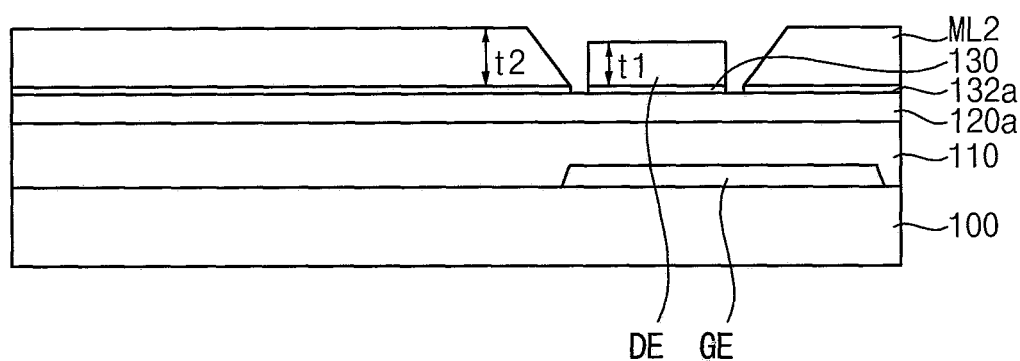

Referring to FIG. 4E, the first photoresist pattern PR1 and the material layers formed on the first photoresist pattern PR1 may be removed. In an exemplary embodiment, for example, the first photoresist pattern PR1 may be removed through a lift-off process. With the removal of the first photoresist pattern PR1 and the material layers formed thereon, an upper surface of the drain electrode DE is exposed.

Figure 4F:
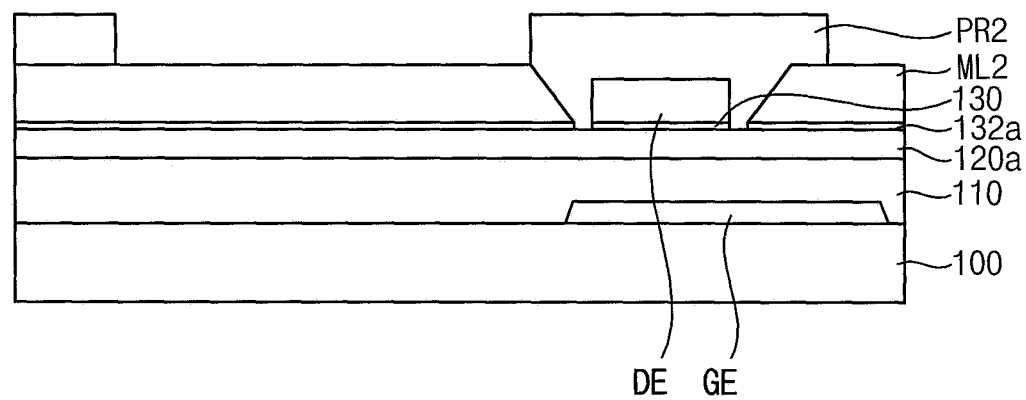

Referring to FIG. 4F, a second photoresist pattern PR2 may be formed on the remaining second conductive layer ML2 and the exposed drain electrode DE. The second photoresist pattern PR2 may cover the drain electrode DE, a portion of the preliminary semiconductor layer 120a exposed between the drain electrode DE and the second conductive layer ML2 where the channel will be formed, and a portion of the second conductive layer ML2 where source electrode and a data line will be formed.

Figure 4G:
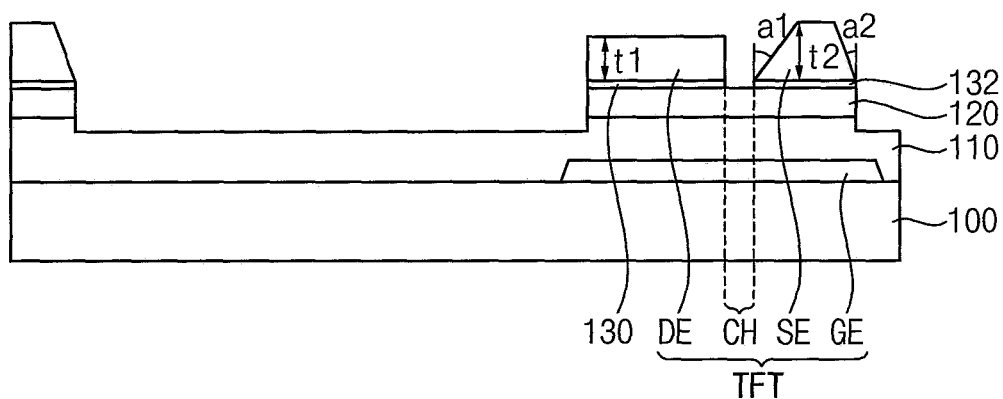

Referring to FIG. 4G; the second conductive layer ML2, the second ohmic contact layer 132a and the preliminary semiconductor layer 120a may be patterned using the second photoresist pattern PR2 as a mask. Accordingly, a semiconductor layer 120, a source electrode SE, a data line (refer to DL in FIG. 2) and a second ohmic contact layer 132 under the source electrode SE may be formed. The first ohmic contact layer 130 and the second ohmic contact layer 132 may include a same material as each other but are formed by different manufacturing processes. The drain electrode DE and the source electrode SE (and data line) may include a same material as each other but are formed by different manufacturing processes. The source electrode SE, the second ohmic contact layer 132 and the semiconductor layer 120 may be formed by wet or dry etching process. The remaining second photoresist pattern PR2 may be removed.

Here, the source electrode SE may include a first side surface adjacent to the drain electrode DE and a second side surface opposite to the first side surface. A width of the upper surface of the source electrode SE may be smaller than a width of a lower surface of the source electrode SE. The first side surface may be formed to be inclined at a first inclination angle a1 with respect to a normal direction relative to an upper surface of the first base substrate 100. The second side surface may be formed to be inclined at a second inclination angle a2 with respect to the normal direction.

The first inclination angle a1 may be larger than the second inclination angle a2. Thus, the source electrode SE may be formed so that a taper inclination from the first side surface toward an opposite side is greater than a taper inclination from the opposite side toward the drain electrode DE. For example, the first inclination angle a1 may be about 60 degrees to about 80 degrees, the second inclination angle a2 may be about 10 degrees to about 20 degrees. The inclination angles of the second side surface being different from that of the first side surface is due to no shadow effect in the etching process.

The first ohmic contact layer 130 and the second ohmic contact layer 132 may be spaced apart from each other on the semiconductor layer 120. A channel CH of the thin film transistor TFT may be formed by the distance of the semiconductor layer 120 in a direction between the source and drain electrodes SE and DE, between the first ohmic contact layer 130 and the second ohmic contact layer 132 spaced apart from each other.

Figure 4H:
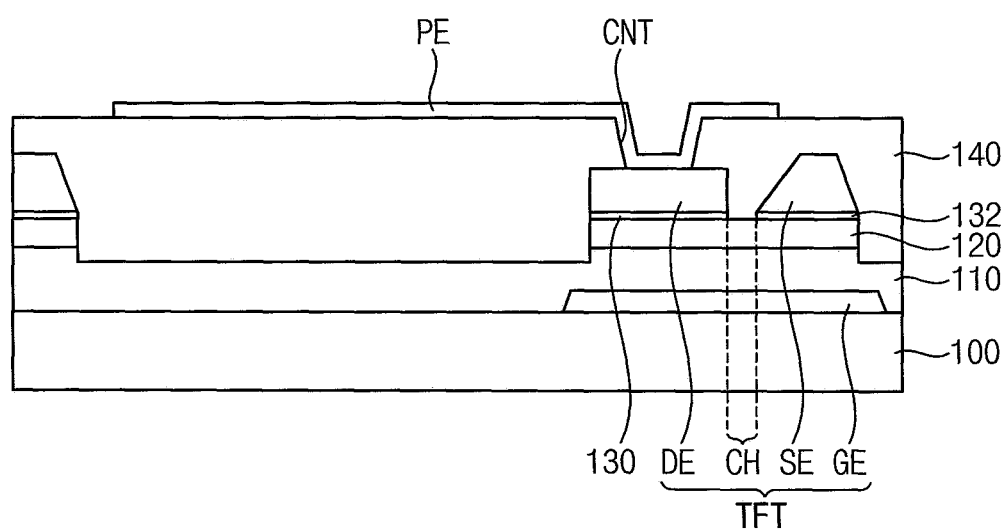

Referring to FIG. 4H, a second insulation layer 140 may be formed on the first insulation layer 110 on which the thin film transistor TFT is formed. The second insulation layer 140 may be formed may be formed by a spin coating process, a printing process, a CVD process, a PECVD process, an HDP-CVD process, etc. in accordance with ingredients included in the second insulation layer 140.

And then, a contact hole CNT which exposes the drain electrode DE through the second insulation layer 140 may be formed therein. A pixel electrode PE may be formed on the second insulation layer 140 through which the contact hole CNT is formed. Accordingly, a first substrate of the display apparatus including the first base substrate 100, the first insulation layer 110, the thin film transistor TFT, the second insulation layer 140 and the pixel electrode PE may be formed.

Figure 4I:
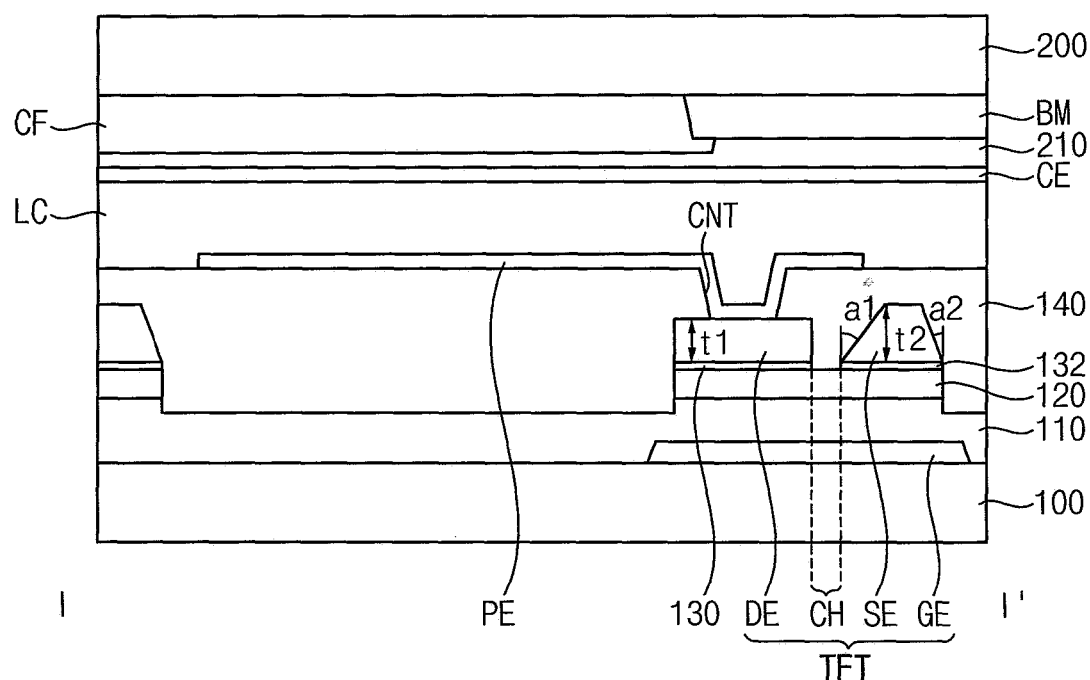

Referring to FIG. 4I, for a second substrate of the display apparatus, a black matrix BM may be formed on a second base substrate 200. A color filter CF may be formed on the second base substrate 200 on which the black matrix BM is formed. An over-coating layer 210 may be formed on the color filter CF and the black matrix BM. A common electrode CE may be formed on the over-coating layer 210. Accordingly, the second substrate of the display apparatus including the second base substrate 200, the black matrix BM, the over-coating layer 210 and the common electrode CE may be formed.

An optical medium or light transmittance layer such as a liquid crystal layer LC may be formed between the pixel electrode PE and the common electrode CE. The liquid crystal layer LC may be formed by injecting a liquid crystal material between the first substrate and the second substrate, or may be formed by dropping a liquid crystal material on the first substrate and/or the second substrate, and the first and second substrates may be bonded to each other. Accordingly, the display apparatus may be manufactured.

FIGS. 5A to 5H are cross-sectional views illustrating another exemplary embodiment of a method of manufacturing a display apparatus according to the invention. The cross-sectional view of FIGS. 5A to 5H may be taken along line I-I' of FIG. 2, similar to that of FIG. 3.

Figure 5A:
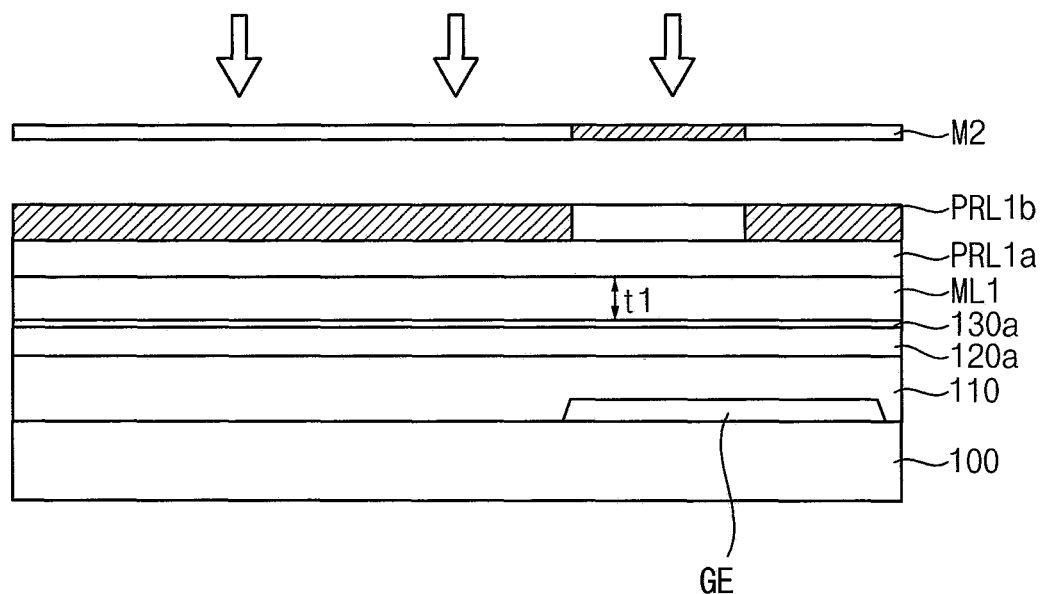
FIGS. 5A to 5H are cross-sectional views illustrating another exemplary embodiment of a method of manufacturing a display apparatus according to the invention.

Referring to FIG. 5A, a first base substrate 100 may be provided. A gate pattern including a gate electrode GE may be formed on the first base substrate 100. A first insulation layer 110 may be formed on the first base substrate 100 on which the gate pattern is formed. A preliminary semiconductor layer 120a including of amorphous silicon (a-Si: H) and may be formed on the first insulation layer 110. A preliminary first ohmic contact layer 130a including of n+ amorphous silicon (n+ a-Si: H) may be formed on the preliminary semiconductor layer 120a. A first conductive layer ML1 may be formed on the preliminary first ohmic contact layer 130a. The first conductive layer ML1 may have a first thickness t1.

A method of manufacturing the first base substrate 100, the gate electrode GE, the first insulation layer 110, the preliminary semiconductor layer 120a, the preliminary first ohmic contact layer 130a and the first conductive layer ML1 may be substantially same as the method of manufacturing the display apparatus of FIG. 4A. Thus, any further detailed descriptions concerning the same elements will be omitted.

A first-a photoresist layer PRL1a may be formed on the first conductive layer ML1. The first-a photoresist layer PRL1a may be formed using non-photosensitive resist composition. And then, a first-b photoresist layer PRL1b may be formed on the first-a photoresist layer PRL1a. The first-b photoresist layer PRL1b may be formed using photosensitive resist composition.

More specifically, the non-photosensitive resist composition of the first-a photoresist layer PRL1a may include an alkali-soluble polymer and an organic solvent. The alkali-soluble polymer includes a repeating unit containing a hydroxyl group or a carboxyl group. In an exemplary embodiment, for example, the repeating unit of the alkali-soluble polymer may contain an alcohol hydroxyl group or a phenol hydroxyl group. The alkali-soluble polymer includes a plurality of repeating units repeatedly coupled to each other. The alkali-soluble polymer is soluble in an alkali solution. The weight average molecular weight of the alkali-soluble polymer may be preferably about 3,000 to about 30,000.

The organic solvent of the non-photosensitive resist composition of the first-a photoresist layer PRL1a dissolves the alkali-soluble polymer. Examples of the organic solvent may include an alcohol such as methanol, ethanol and the like; a glycol ether; an alkylene glycol alkyl ether acetate; a diethylene glycol; a monoalkyl ether; an aromatic hydrocarbon; a ketone; an ester such as 3-hydroxypropionic acid methyl, 2-hydroxy-3-methylbutanoic acid methyl; methoxyacetic acid methyl and the like. These can be used alone or in a combination thereof.

The photosensitive resist composition of the first-b photoresist layer PRL1b includes an alkali-soluble resin, a photoreactive compound and an organic solvent. Examples of the photosensitive resist composition may include a conventional positive photoresist composition used for a photography process.

The alkali-soluble resin of the first-b photoresist layer PRL1b includes a repeating unit containing a phenol hydroxyl group. For example, a phenol-based compound and an aldehyde compound may be reacted with each other in the presence of an acidic catalyst to prepare the alkali-soluble resin. Examples of the phenol-based compound may include phenol, o-cresol, m-cresol, p-cresol and the like. These can be used alone or in a combination thereof. Examples of the aldehyde compound may include formaldehyde, formalin, p-formaldehyde, trioxane and the like.

The photoreactive compound of the first-b photoresist layer PRL1b may generate Bronsted acid and/or Lewis acid. Examples of the photoreactive compound may include an onium salt, a halogenated organic compound, a quinone diazide compound, a bis(sulfonyl)diazomethane compound, a sulfone compound, an organic acid ester compound, an organic amide compound, an organic imide compound and the like. These can be used alone or in a combination thereof.

The organic solvent of the photosensitive resist composition of the first-b photoresist layer PRL1b may dissolve the alkali-soluble resin and the photoreactive compound. Preferably, the organic solvent of the photosensitive resist composition may not dissolve the alkali-soluble polymer of the non-photosensitive resist composition. Examples of the organic solvent of the photosensitive resist composition may include a polar solvent such as heptanone, cyclohexanone, 2-hydroxyisobutyric acid methyl ester, lactone and the like. These can be used alone or in a combination thereof.

The non-photosensitive resist composition of the first-a photoresist layer PRL1a dissolves may be dripped onto the first conductive layer ML1, and then the non-photosensitive resist composition may be spin-coated and/or slit-coated on entire surface of the first conductive layer ML1. The first base substrate 100 on which the non-photosensitive resist composition is coated may be thermally treated to form the first-a photoresist layer PRL1a.

The photosensitive resist composition of the first-b photoresist layer PRL1b may be dripped onto the first-a photoresist layer PRL1a, and then the photosensitive resist composition may be spin-coated and/or slit-coated on entire surface of the first-a photoresist layer PRL1a. The first base substrate 100 on which the photosensitive resist composition is coated may be thermally treated to form the first-b photoresist layer PRL1b. By using the above-mentioned polar solvent in the photosensitive resist composition of the first-b photoresist layer PRL1b, damage to the first-a photoresist layer PRL1a by the photosensitive resist composition is reduced or effectively prevented, so that the first-b photoresist layer PRL1b may be stably formed on the first-a photoresist layer PRL1a.

The first-b photoresist layer PRL1b may be exposed (downward arrows in FIG. 5A) using a second mask M2 which has a pattern corresponding to a drain electrode (refers to DE of FIG. 5C) which will be mentioned later.

Figure 5B:
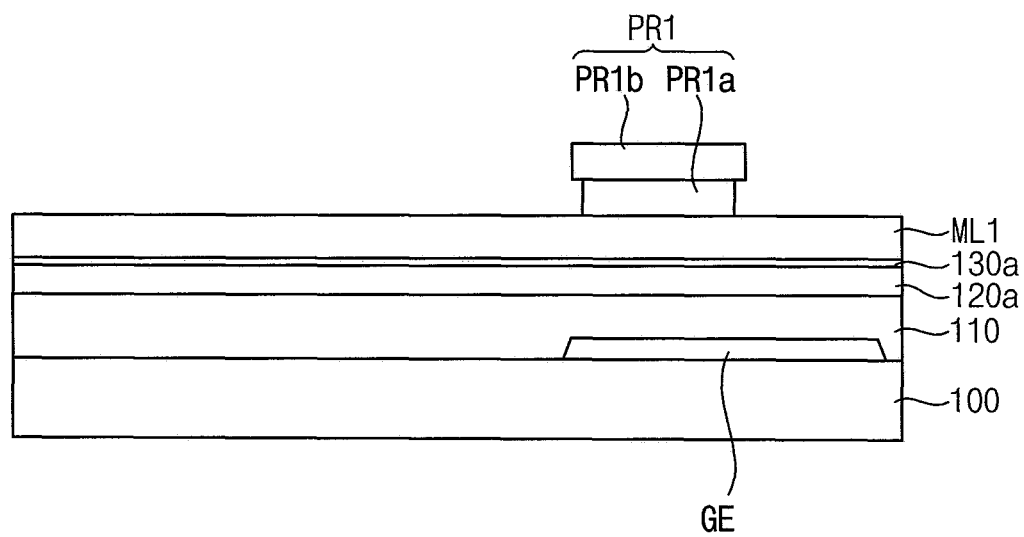

Referring to FIG. 5B, the first-b photoresist layer PRL1b and the first-a photoresist layer PRL1a which have been exposed, may be developed using a developer to form a first photoresist pattern PR1 which includes a first-b photoresist pattern PR1b and a first-a photoresist pattern PR1a. Accordingly, the first photoresist pattern PR1 may be formed on the first conductive layer ML1.

The developer may be preferably an alkaline developer of the first-b photoresist layer PRL1b.

Specifically, as the first-b photoresist layer PRL1b is irradiated by light (downward arrows in FIG. 5A), the photoreactive compound of the photosensitive resist composition reacts with the light. Accordingly, the first-b photoresist layer PRL1b in a region irradiated with the light is dissolved and removed in the alkaline developer, and the first-b photoresist layer PRL1b in a region where light is not provided remains to form the first-b photoresist pattern PR1b.

The first-b photoresist pattern PR1b protects the first-a photoresist layer PRL1a under the first-b photoresist pattern PR1b. In a subsequent processes, the first-b photoresist pattern PR1b serves to prevent dissolution of the first-a photoresist layer PRL1a under the first-b photoresist pattern PR1b by the alkaline developer.

The first-a photoresist pattern PR1a may be formed by patterning the first-a photoresist layer PRL1a successively with the formation of the first-b photoresist pattern PR1b. Accordingly, the first photoresist pattern PR1 including the first-b photoresist pattern PR1b and the first-a photoresist pattern PR1a may be formed.

Specifically, when the alkaline developer is continuously supplied to the first base substrate 100 on which the first-b photoresist pattern PR1b is formed, the alkaline developer dissolves the first-a photoresist layer PRL1a.

Since the first-a photoresist layer PRL1a does not contain the compound that reacts with the light unlike the first photoresist layer PRL1b, even if the light reaches the first-a photoresist layer PRL1a in the exposure process, state of the first-a photoresist layer PRL1a is not changed by light. That is, a portion of the first-a photoresist layer PRL1a where the light is provided and a portion of the first-a photoresist layer PRL1a where the light is not provided can all be dissolved by the alkaline developer. However, since the first-b photoresist pattern PR1b is formed on the first-a photoresist layer PRL1a, a portion of the first-a photoresist layer PRL1a which is covered by the first-b photoresist pattern PR1b is not exposed to the alkaline developer. Other portions of the first-a photoresist pattern PR1a exposed by the first-b photoresist pattern PR1b are isotropically removed by the alkaline developer so that the first photoresist pattern PR1a is formed.

Accordingly, a width of the first-a photoresist pattern PR1a is formed to be smaller than that of the first-b photoresist pattern PR1b, and side surfaces of the first photoresist pattern PR1 including the first photoresist pattern PR1a and the first-b photoresist pattern PR1b may have an overall reverse tapered shape or an undercut shape similar to that in FIG. 4B described above.

Figure 5C:
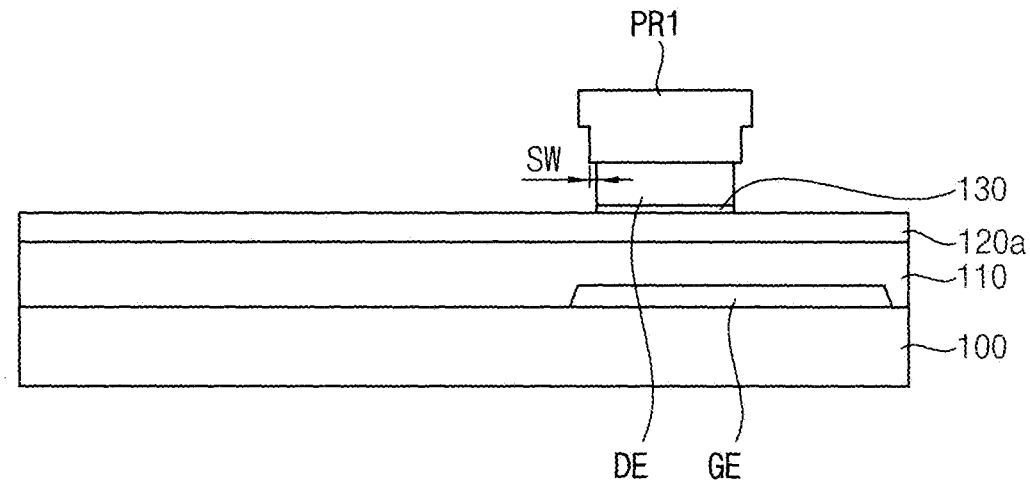

Referring to FIG. 5C, the first conductive layer ML1 and the preliminary first ohmic contact layer 130a may be patterned using the first photoresist pattern PR1 as a mask. The first photoresist pattern PR1 is shown as a unity element for convenience of explanation, but includes the first-a photoresist pattern PR1a is formed to be smaller than that of the first-b photoresist pattern PR1b as shown in FIG. 5B.

Accordingly, a drain electrode DE under the first photoresist pattern PR1 and a first ohmic contact layer 130 under the drain electrode DE may be formed. The first conductive layer ML1 may be patterned using the first photoresist pattern PR1 as an etch barrier by an isotropic etching process such as a wet etch process.

Here, the first conductive layer ML1 is etched by the isotropic etching process and side surfaces of the first photoresist pattern PR1 form the reverse tapered shape, so that edges of the drain electrode DE are disposed inside an outer edge of the first photoresist pattern PR1 by a width SW, and skew may occur.

Referring to FIG. 5C, the etching of the first conductive layer ML1 and the preliminary first ohmic contact layer 130a to form the drain electrode DE and the first ohmic contact layer 130, portions of the preliminary semiconductor layer 120a are exposed.

Figure 5D:
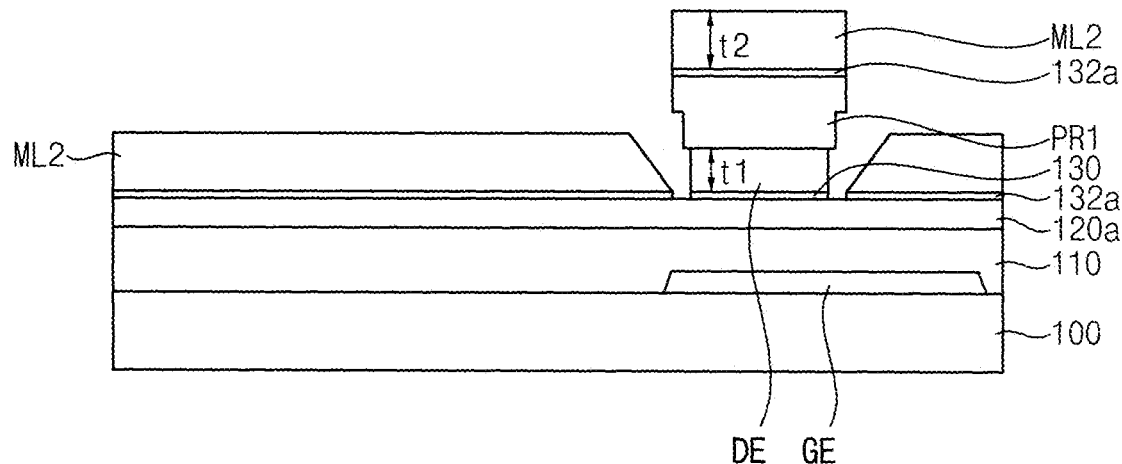

Referring to FIG. 5D, a preliminary second ohmic contact layer 132a and a second conductive layer ML2 may be formed on the first photoresist pattern PR1, the drain electrode DE and the exposed portions of the preliminary semiconductor layer 120a.

Figure 5E:
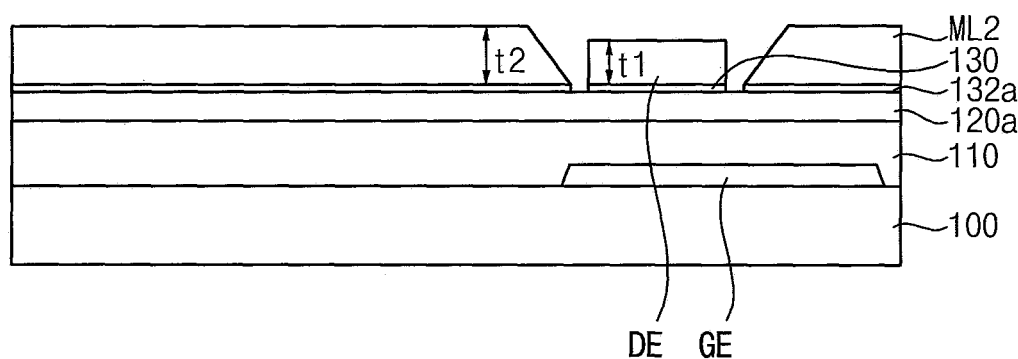

Referring to FIG. 5E, the first photoresist pattern PR1 and the material layers formed on the first photoresist pattern PR1 may be removed. In an exemplary embodiment, for example, the first photoresist pattern PR1 may be removed through a lift-off process. With the removal of the first photoresist pattern PR1 and the material layers formed thereon, an upper surface of the drain electrode DE is exposed.

Figure 5F:
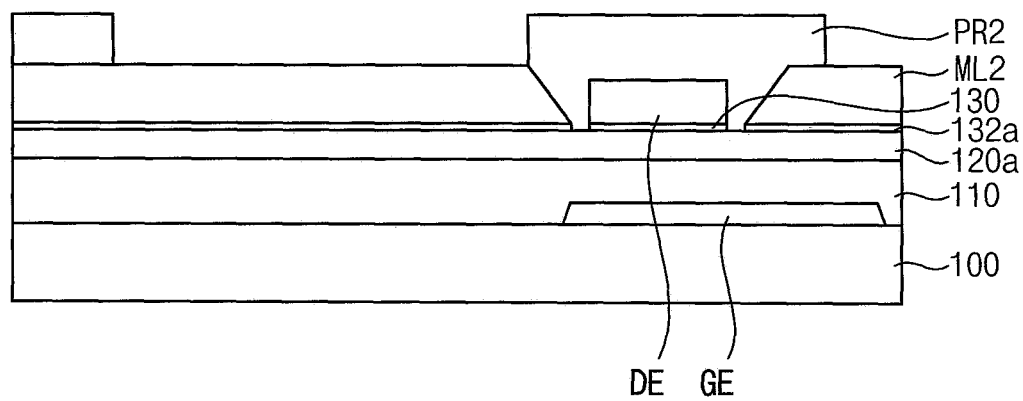

Referring to FIG. 5F, a second photoresist pattern PR2 may be formed on the remaining second conductive layer ML2 and the exposed drain electrode DE. The second photoresist pattern PR2 may cover the drain electrode DE, a portion of the preliminary semiconductor layer 120a exposed between the drain electrode DE and the second conductive layer ML2 where the channel will be formed, and a portion of the second conductive layer ML2 where source electrode and a data line will be formed.

Figure 5G:
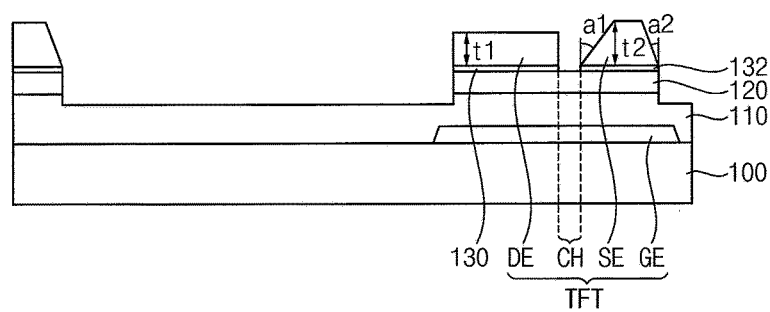

Referring to FIG. 5G, the second conductive layer ML2, the second ohmic contact layer 132a and the preliminary semiconductor layer 120a may be patterned using the second photoresist pattern PR2 as a mask. Accordingly, a semiconductor layer 120, a source electrode SE, a data line (refer to DL in FIG. 2) and a second ohmic contact layer 132 under the source electrode SE may be formed. The source electrode SE, the second ohmic contact layer 132 and the semiconductor layer 120 may be formed by wet or dry etching process. The remaining second photoresist pattern PR2 may be removed.

Here, the source electrode SE may include a first side surface adjacent to the drain electrode DE and a second side surface opposite to the first side surface. A width of the upper surface of the source electrode SE may be smaller than a width of a lower surface of the source electrode SE. The first side surface may be formed to be inclined at a first inclination angle a1 with respect to a normal direction relative to an upper surface of the first base substrate 100. The second side surface may be formed to be inclined at a second inclination angle a2 with respect to the normal direction. The first inclination angle a1 may be larger than the second inclination angle a2.

Figure 5H:
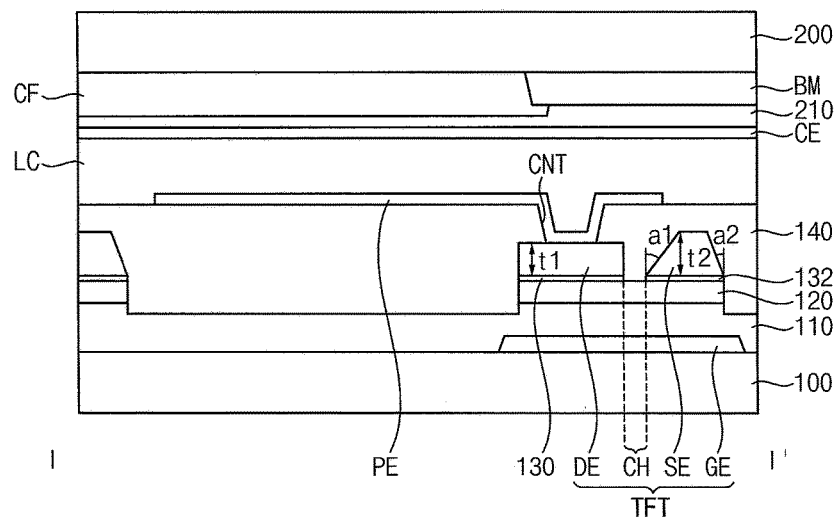

Referring to FIG. 5H, a second insulation layer 140 may be formed on the first insulation layer 110 on which the thin film transistor TFT is formed. And then, a contact hole CNT which exposes the drain electrode DE through the second insulation layer 140 may be formed therein. A pixel electrode PE may be formed on the second insulation layer 140 through which the contact hole CNT is formed. Accordingly, a first substrate of the display apparatus including the first base substrate 100, the first insulation layer 110, the thin film transistor TFT, the second insulation layer 140 and the pixel electrode PE may be formed.

A second substrate including a second base substrate 200, a black matrix BM, a color filter CF, an over-coating layer 210 and a common electrode CE may be formed.

An optical medium or light transmittance layer such as a liquid crystal layer LC may be formed between the pixel electrode PE and the common electrode CE. Accordingly, the display apparatus may be manufactured. Process of FIGS. 5C to 5H may be substantially same as that of FIG. 4C to 4I.

According to one or more exemplary embodiment, as the width of the channel of the thin film transistor TFT is relatively small, electrical characteristics of the thin film transistor TFT may be improve and display quality of the display apparatus may be improved. In addition, the second thickness of the second pattern including the data line is greater than the first thickness of the first data pattern including the drain electrode, electrical characteristics of the display apparatus may be improved, and the display quality of the display apparatus may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
   a thin film transistor on a first base substrate, the thin film transistor comprising:
   a gate electrode disposed on the first base substrate;
   an active pattern disposed on the first base substrate, the active pattern comprising:
   a semiconductor layer including amorphous silicon, and
   a first ohmic contact layer and a second ohmic contact layer disposed on the semiconductor layer;
   a drain electrode corresponding to the first ohmic contact layer and spaced apart from the second ohmic contact layer, the drain electrode being a portion of a first conductive layer in contact with the active pattern; and
   a source electrode corresponding to the second ohmic contact layer and spaced apart from the first ohmic contact layer, the source electrode being a portion of a second conductive layer different from the first conductive layer and in contact with the active pattern,
   wherein
   the source electrode has a second thickness which is greater than a first thickness of the drain electrode,
   the source electrode comprises a first side surface adjacent to the drain electrode, a second side surface which is opposite to the first side surface, a lower surface facing the active pattern and an upper surface which is opposite to the lower surface,
   a width of the upper surface of the source electrode is smaller than a width of the lower surface of the source electrode,
   with respect to a normal direction to an upper surface of the first base substrate, the first side surface of the source electrode is inclined at a first inclination angle and the second side surface of the source electrode is inclined at a second inclination angle,
   the first inclination angle is greater than the second inclination angle, and
   the first side surface is closer to the drain electrode than the second side surface.

2. The display apparatus of claim 1, wherein
   the second ohmic contact layer spaced apart from the drain electrode defines a spacing distance therebetween, and
   a width of a channel of the thin film transistor includes the spacing distance.

3. The display apparatus of claim 2, wherein the width of the channel of the thin film transistor is at least twice the first thickness of the drain electrode.

4. The display apparatus of claim 3, wherein the width of the channel is about 1 micrometer to about 2 micrometers.

5. The display apparatus of claim 1, wherein
   the first inclination angle is about 60 degrees to about 80 degrees, and
   the second inclination angle is about 10 degrees to about 20 degrees.

6. The display apparatus of claim 2, wherein second thickness of the source electrode is at least 1.2 times the first thickness of the drain electrode.

7. The display apparatus of claim 6, wherein the first thickness is about 0.5 micrometer to about 1 micrometer.

8. The display apparatus of claim 2, further comprising:
   a first insulation layer disposed between the gate electrode and the active pattern;
   a second insulation layer disposed on the drain electrode;
   a pixel electrode disposed on the second insulation layer, the pixel electrode electrically connected to the drain electrode through a contact hole in the second insulation layer;
   a gate line electrically connected to the gate electrode; and
   a data line electrically connected to the source electrode,
   wherein a thickness of the data line defines the second thickness of the source electrode.

9. The display apparatus of claim 1, wherein
   the semiconductor layer comprises a first end and a second end opposite to each other,
   the drain electrode comprise a first outer side surface which is furthest from the source electrode and aligned with the first end of the semiconductor layer,
   the source electrode comprises a second outer side surface which is furthest from the drain electrode and aligned with the second end of the semiconductor layer,
   the drain electrode for which the first outer side surface thereof is aligned with the first end of the semiconductor layer, is a portion of the first conductive layer which is in contact with the active pattern and has the first thickness, and the source electrode for which the second outer side surface thereof is aligned with the second end of the semiconductor layer, is a portion of the second conductive layer which is different from the first conductive layer, is in contact with the active pattern and has the second thickness which is greater than the first thickness.

* * * * *